(12) United States Patent
Rupert et al.

(10) Patent No.: US 8,624,578 B2
(45) Date of Patent: Jan. 7, 2014

(54) BRANCH CURRENT MONITOR WITH CONFIGURATION

(75) Inventors: Matthew Rupert, Amity, OR (US); Marc Bowman, Portland, OR (US); Michael Bitsch, Hillsboro, OR (US); Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 564 days.

(21) Appl. No.: 12/765,536

(22) Filed: Apr. 22, 2010

(65) Prior Publication Data

US 2010/0308792 A1    Dec. 9, 2010

Related U.S. Application Data

(60) Provisional application No. 61/217,945, filed on Jun. 4, 2009.

(51) Int. Cl.
| | |
|---|---|
| G01R 25/00 | (2006.01) |
| G01R 7/00 | (2006.01) |
| G01R 1/00 | (2006.01) |
| G01R 31/08 | (2006.01) |
| G01R 31/00 | (2006.01) |
| G01R 21/00 | (2006.01) |
| H02H 3/00 | (2006.01) |
| H02H 9/04 | (2006.01) |

(52) U.S. Cl.
USPC ........ 324/76.77; 324/142; 324/110; 324/522; 361/85; 361/93.2; 702/58; 702/60

(58) Field of Classification Search
USPC ............................................. 324/76.77, 522
See application file for complete search history.

(56) References Cited

U.S. PATENT DOCUMENTS

| | | | | | |
|---|---|---|---|---|---|
| 3,500,194 | A | * | 3/1970 | Smith | 324/110 |
| 4,110,807 | A | * | 8/1978 | Neuhouser | 361/42 |
| 4,418,269 | A | * | 11/1983 | Eaton-Williams | 392/326 |
| 4,492,918 | A | * | 1/1985 | Hernandez et al. | 324/76.77 |
| 4,558,310 | A | * | 12/1985 | McAllise | 340/661 |
| 4,636,720 | A | * | 1/1987 | Farr | 324/86 |
| 4,785,406 | A | * | 11/1988 | Lunderius et al. | 700/293 |
| 5,122,735 | A | * | 6/1992 | Porter et al. | 324/142 |
| 5,337,206 | A | * | 8/1994 | Kadah et al. | 361/85 |
| 5,471,359 | A | * | 11/1995 | Simpson et al. | 361/93.2 |
| 5,475,558 | A | * | 12/1995 | Barjonnet et al. | 361/64 |
| 5,548,527 | A | * | 8/1996 | Hemminger et al. | 702/62 |
| 5,708,364 | A | * | 1/1998 | Vokey et al. | 324/523 |
| 5,736,847 | A | * | 4/1998 | Van Doorn et al. | 324/142 |
| 5,825,173 | A | * | 10/1998 | Lim | 324/76.77 |
| 5,861,683 | A | * | 1/1999 | Engel et al. | 307/38 |

(Continued)

OTHER PUBLICATIONS

Hengchun Mao, Fred C. Y. Lee, Dushan Boroyevich, and Silva Hiti, Review of High-Performance Three-Phase Power-Factor Correction Circuits, IEEE Transactions on Industrial Electronics, vol. 44, No. 4, Aug. 1997, pp. 437-446.*

(Continued)

Primary Examiner — Jermele M Hollington
Assistant Examiner — Christopher McAndrew
(74) Attorney, Agent, or Firm — Chernoff Vilhauer McClung & Stenzel, LLP

(57) ABSTRACT

A tool for configuring a branch current monitor facilitates mapping the connections of branch circuits to voltage sources in a power distribution panel.

6 Claims, 14 Drawing Sheets

(56) References Cited

U.S. PATENT DOCUMENTS

| | | | |
|---|---|---|---|
| 5,982,596 A * | 11/1999 | Spencer et al. | 361/64 |
| 6,157,527 A * | 12/2000 | Spencer et al. | 361/64 |
| 6,175,810 B1 * | 1/2001 | Jurisch | 702/58 |
| 6,289,267 B1 * | 9/2001 | Alexander et al. | 700/286 |
| 6,292,717 B1 * | 9/2001 | Alexander et al. | 700/293 |
| 6,330,516 B1 * | 12/2001 | Kammeter | 702/60 |
| 6,737,854 B2 | 5/2004 | Bruno et al. | |
| 6,809,509 B2 * | 10/2004 | Bruno et al. | 324/157 |
| 6,937,003 B2 * | 8/2005 | Bowman et al. | 324/117 R |
| 7,157,899 B2 | 1/2007 | Bruno | |
| 7,161,345 B2 | 1/2007 | Bruno | |
| 7,221,145 B2 * | 5/2007 | Bowman et al. | 324/142 |
| 7,230,414 B2 * | 6/2007 | Bruno | 324/127 |
| 7,330,022 B2 * | 2/2008 | Bowman et al. | 324/117 R |
| 7,359,809 B2 | 4/2008 | Bruno | |
| 7,447,603 B2 | 11/2008 | Bruno | |
| 7,453,267 B2 * | 11/2008 | Westbrock et al. | 324/522 |
| 7,474,088 B2 * | 1/2009 | Bowman et al. | 324/142 |
| 7,493,222 B2 | 2/2009 | Bruno | |
| 7,526,393 B2 * | 4/2009 | Thurmond et al. | 702/60 |
| 7,660,776 B1 * | 2/2010 | Kious | 706/45 |
| 7,855,655 B2 * | 12/2010 | Hunter et al. | 340/664 |
| 7,902,992 B2 * | 3/2011 | Hunter | 340/664 |
| 8,081,003 B2 * | 12/2011 | Pacha et al. | 324/537 |
| 2003/0102968 A1 * | 6/2003 | Bruno et al. | 340/531 |
| 2003/0141874 A1 * | 7/2003 | Weinmann | 324/522 |
| 2003/0169029 A1 * | 9/2003 | Piesinger | 324/66 |
| 2003/0184279 A1 * | 10/2003 | Bruno et al. | 324/117 R |
| 2005/0093376 A1 * | 5/2005 | Cleveland | 307/147 |
| 2007/0010916 A1 * | 1/2007 | Rodgers et al. | 700/295 |
| 2009/0322314 A1 * | 12/2009 | Long et al. | 324/142 |

OTHER PUBLICATIONS

Tsai-Hsiang Chen & Yung-Liang Chang, Integrated Models of Distribution Transformers and Their Loads for Three-phase Power Flow Analyses, IEEE Transactions on Power Delivery, vol. 11, No. 1, Jan. 1996 pp. 507-513.*

Mao, Hengchun et al., Review of High-Performance Three-Phase Power-Factor Correction Circuits, IEEE Transactions on Industrial Electronics, Aug. 1997, vol. 44, No. 4, USA.

* cited by examiner

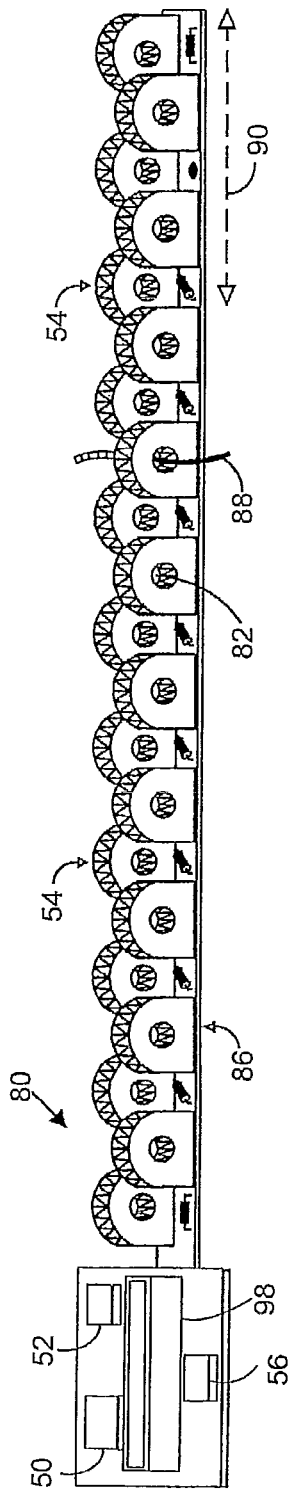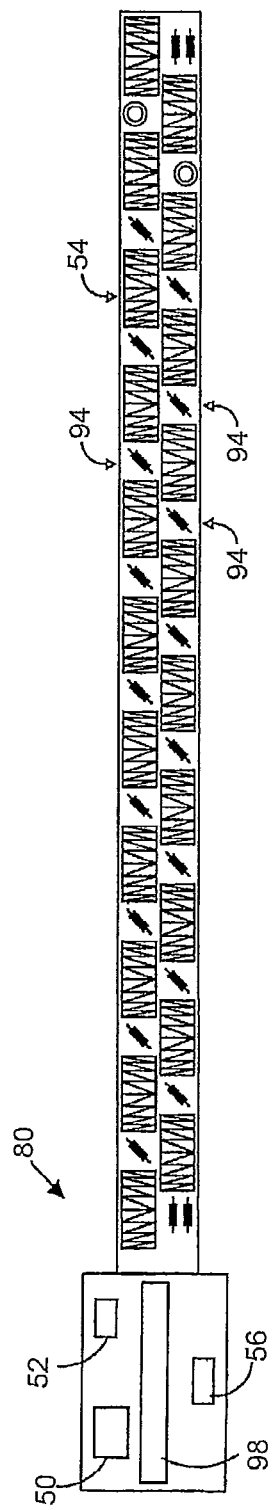
FIG. 2
FIG. 3

BRANCH CURRENT MONITOR WITH CONFIGURATION

CROSS-REFERENCE TO RELATED APPLICATIONS

This application claims the benefit of Provisional App. No. 61/217,945, filed Jun. 4, 2009.

BACKGROUND OF THE INVENTION

The present invention relates to a branch current monitor and, more particularly, to a system for configuring a branch current monitor.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Flexibility has favored adoption of digital branch current monitors incorporating data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While physical installation of the branch current monitor is simplified by mounting the branch circuit current transformers on common supports, system commissioning can be complicated. After the monitor's hardware is installed in the power distribution panel, the panel's hardware and electrical connections and the desired operating attributes of each circuit must be defined in the monitor's memory so that the monitor's data processing unit can access the various sensors and determine the appropriate use of the data received from the sensors. For example, the current rating, high and low voltage limits and current alarm thresholds must be established for each of the circuits and time delays and hysteresis must be defined for the various alarms. In addition, branch current monitoring requires identification of the various circuits that are conducting single-phase, two-phase or three phase power. Data describing the hardware, circuits and desired operating attributes can be entered in a spreadsheet and mapped to a memory in the branch current monitor but it is easy to make a typographical error or other mistake when entering the data describing several characteristics of ninety circuits.

What is desired, therefore, is a simplified system for configuring a branch current monitor.

BRIEF DESCRIPTION OF THE DRAWINGS

FIG. 2 is a perspective view of a current transformer strip for a branch current monitor.

FIG. 3 is a top view of the current transformer strip of FIG. 2.

DETAILED DESCRIPTION OF PREFERRED EMBODIMENTS

Figure 1:
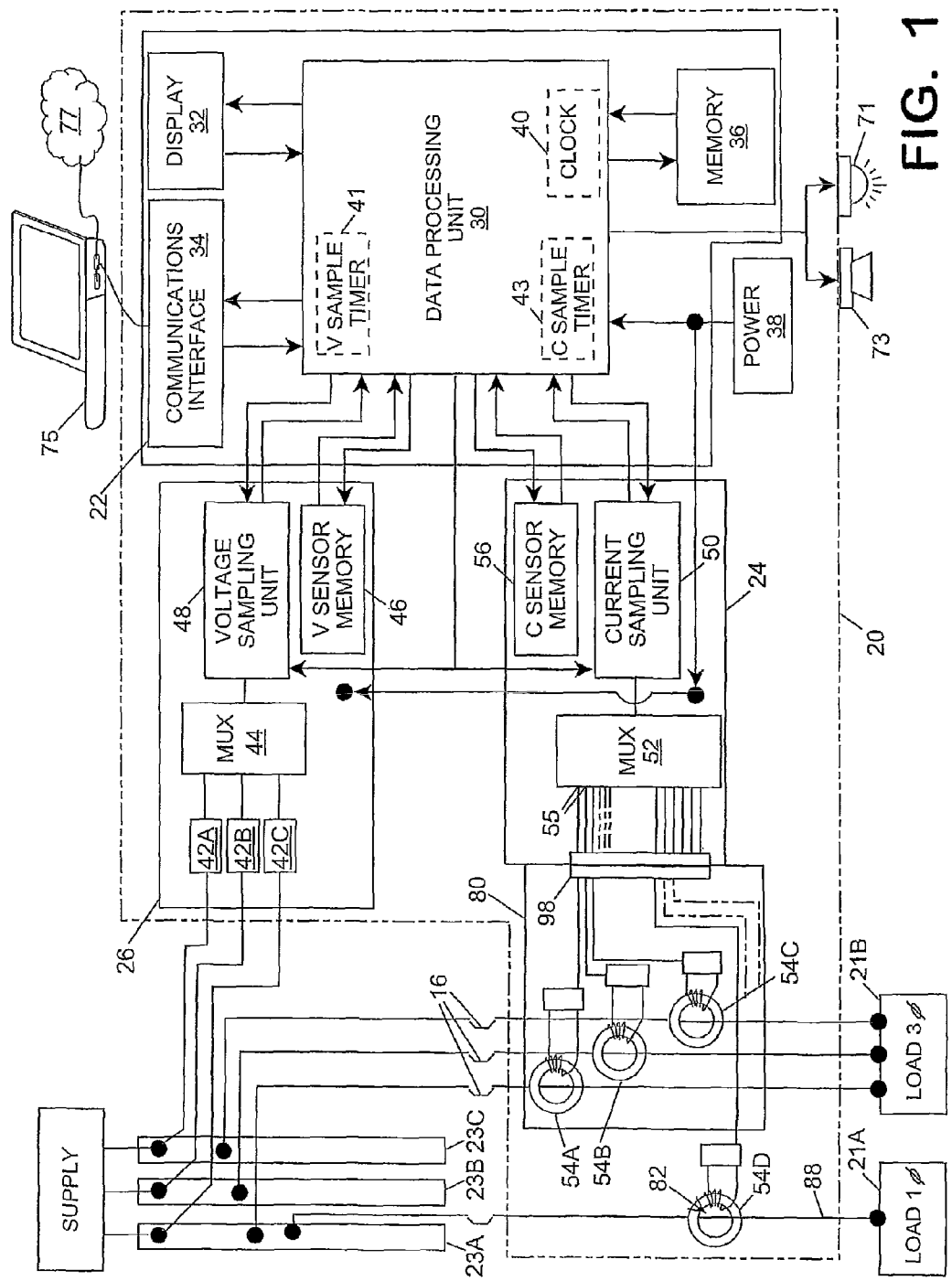
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 4:
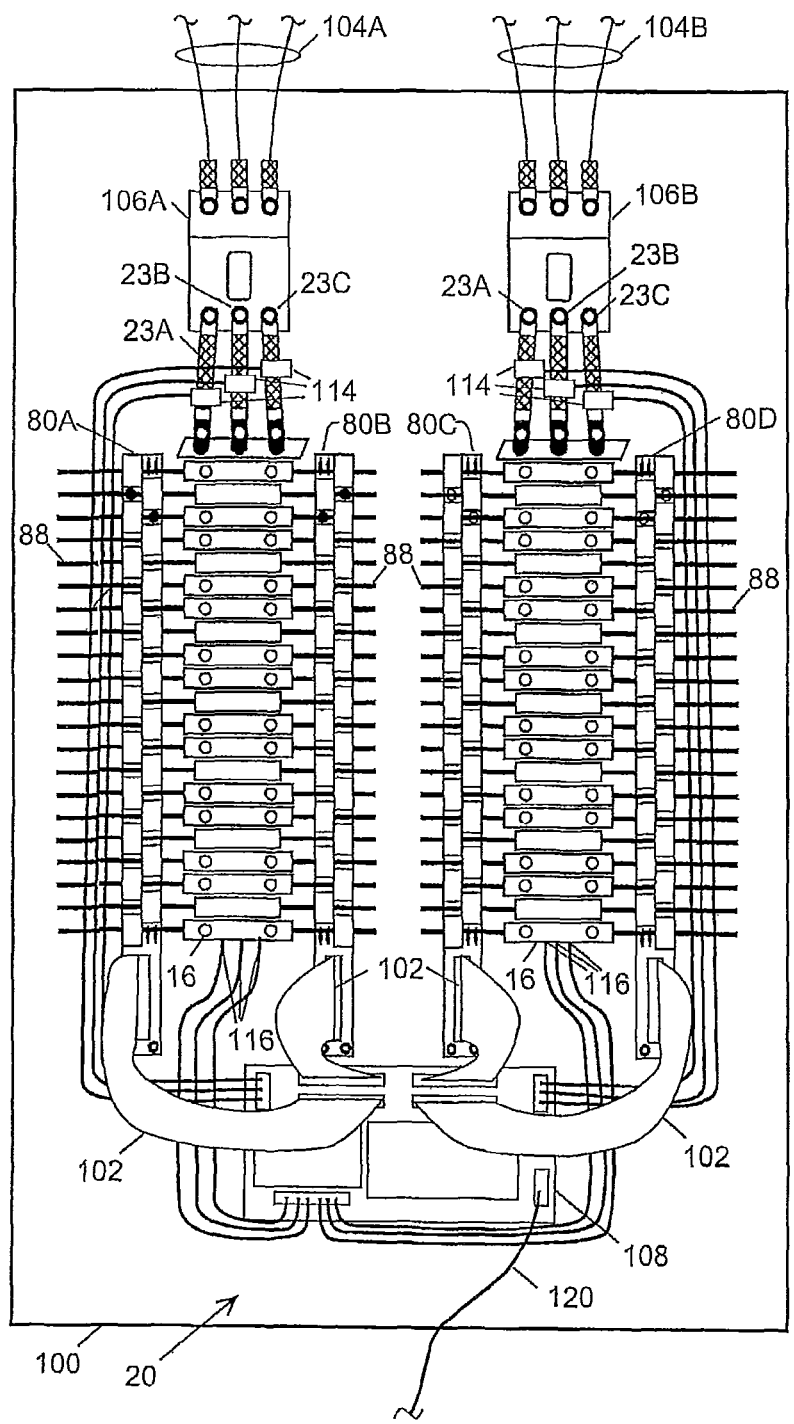
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used. Each current transformer comprises a coil of wire wound on the cross-section of a toroidal metallic or non-metallic core. The toroidal core is typically enclosed in a plastic housing that includes an aperture 82 enabling a power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition, the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

For the branch current monitor to perform its various functions, the various items of hardware comprising the branch current monitor and the power distribution panel and their interconnections must be described to the data processing unit of the monitor and the applicable alarm limits established by the user. For example, the current rating of each circuit breaker, the high and low alarm limits for each circuit and any time delays or other characteristics applicable to the alarms must be defined. In addition, the source of the voltage, the phase of the power conducted by each of the branch circuits, must be defined. The information can be entered in a spreadsheet which is mapped to the branch current monitor's memory but entering the data for ninety circuits is fraught with opportunity for typographical errors and other mistakes making configuration of the monitor potentially problematic. The inventors concluded that configuring a branch current monitor could be simplified and the chance of errors reduced with a configuration tool including a graphical user interface and a plurality of configuration templates related to relevant elements of the monitor and the monitored circuits. In addition, configuration could be simplified if information stored in branch current monitor by the manufacturer or the configuration of one branch current monitor could be uploaded to the configuration tool for use in configuring another monitor. Moreover, configuration could be simplified if the configuration tool aided in the discovery of the connections in the power distribution system.

As illustrated in FIG. 1, the branch current monitor configuration tool is typically installed on a computer 75, typically, comprising a data processing unit to execute instructions; a memory for storing instructions and data utilized by the data processing unit; one or more input devices, such as a keyboard and a mouse; and a display. The computer 75 may be part of or in communication with a data processing network 77, such as a facility management system, and is communicatively connected to the data processing unit of the branch current monitor through the monitor's communication interface. When the configuration tool is activated, instructions executed by the data processing unit of the computer 75 cause a series of templates to be displayable by the computer enabling an installer of a branch current monitor to enter various attributes of elements of the monitor and the power distribution system, for example, the circuit breakers, which are represented as objects in the configuration tool. The tool also prompts the installer by suggesting values of certain attributes of the various objects. Through communication with the data processing unit of the branch current monitor, the tool can both read attributes of the monitor, the power distribution system and their objects that are stored in the monitor's memory, enabling the configuration of a monitor to be copied to another monitor, and can store attributes of the various objects input by the installer in the memory of the monitor to configure the monitor.

Figure 5:
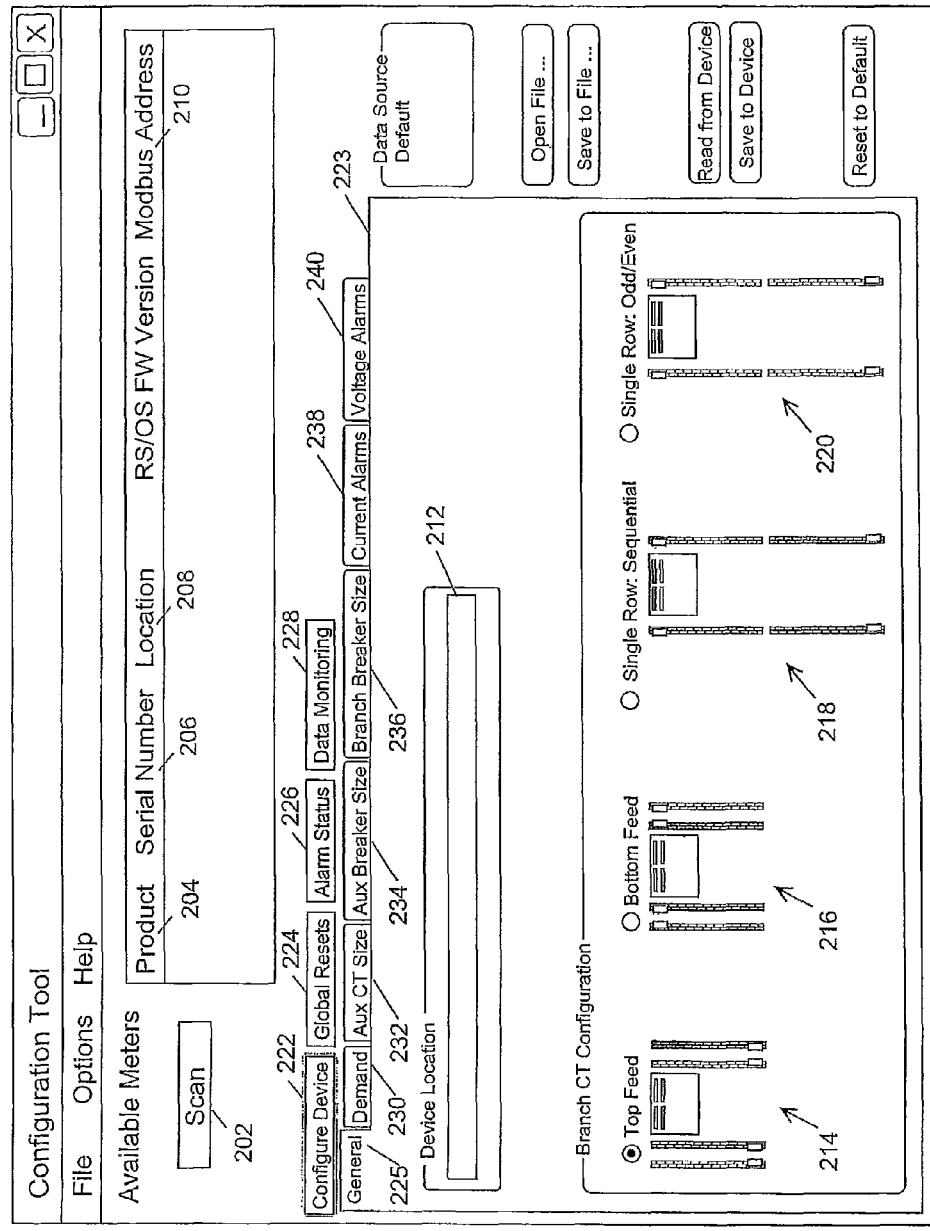
FIG. 5 illustrates a first template of a branch current monitor configuration tool.

Referring to FIG. 5, an initial template 200 of the configuration tool comprises an interface enabling specification of general characteristics of the branch current monitor and its relationship to a larger data processing network, such as a building management system. The data processing unit of the exemplary branch current monitor 20 can communicate with another data processing network utilizing the MODBUS® protocol. Each device in a network utilizing the Modbus protocol must have a unique address. By selecting a scan button 202 on the template, the configuration tool can identify other devices making up a larger system by the product name 204, serial number 206, location 208 and Modbus address 210. The initial template includes a plurality of user selectable buttons, including configure device button 222, which, when selected, displays a tabbed file 223 to facilitate the specification of various attributes of the branch current monitor. When the general tab 225 of the initial template is selected, the installer can enter a general description of the branch current monitor that is being configured. Each distribution panel has a location identification 212 which is used in reporting the operation of the branch current monitor and which can be entered from the template. The template also includes icons 214, 216, 218, 220 representing the four possible arrangements of four current transducer strips that can supported by the monitor enabling the installer to easily select and specify the arrangement of the transducer strips in the particular distribution panel.

Figure 6:
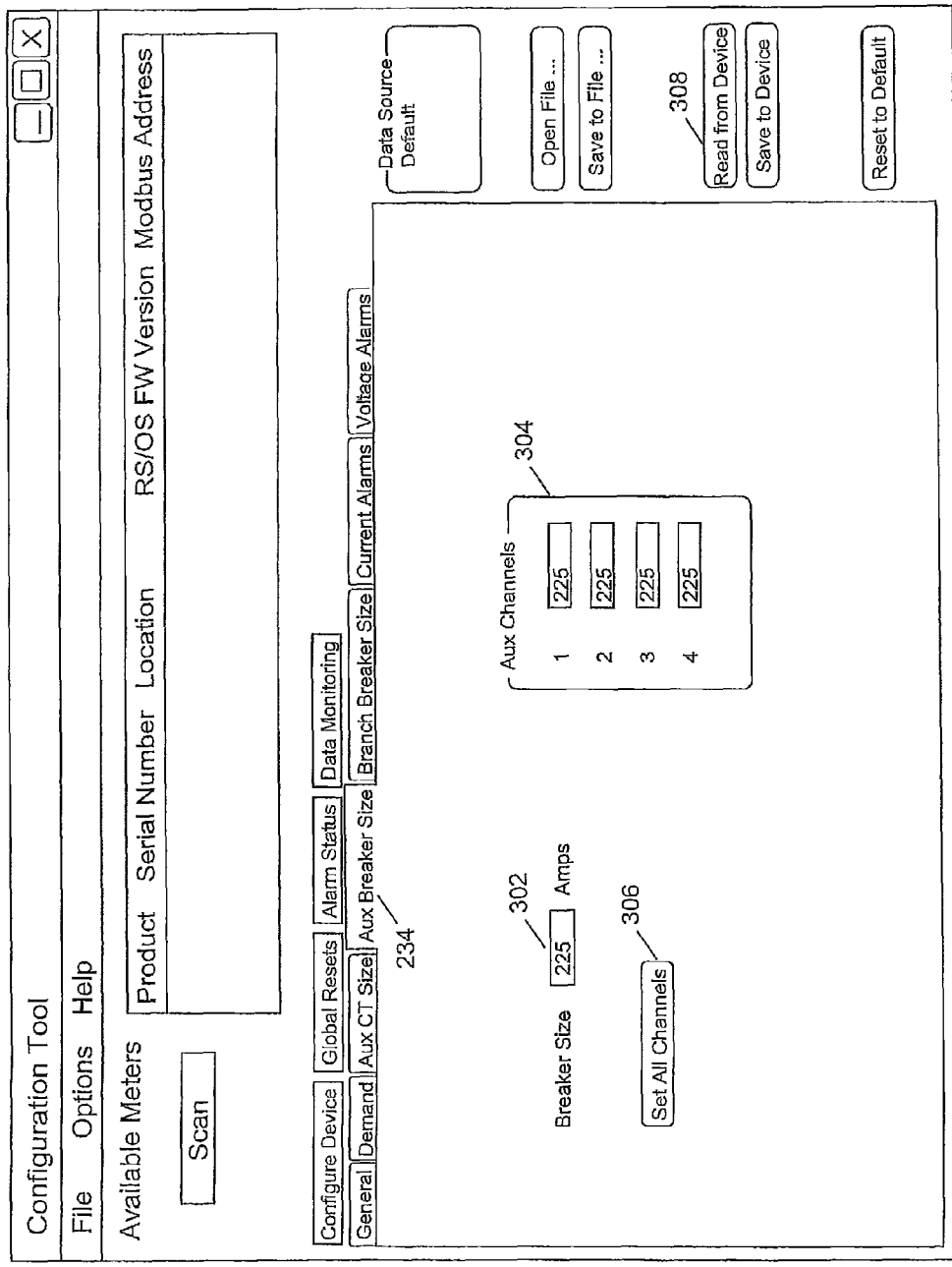
FIG. 6 illustrates a second template of the branch current monitor configuration tool of FIG. 5.

Referring to also FIG. 6, selecting the AUX Breaker Size tab 234 on the initial display 200 displays a template enabling specification of the auxiliary circuit breaker, typically the mains circuit breaker, current rating 300. A typical mains circuit breaker is rated at 225 amps and the configuration tool suggests this size for the mains circuit breakers of the panel. If all the auxiliary circuit breakers have the same current rating the installer can enter the single rating 302 or if the auxiliary circuit breakers have different ratings, for example if one is not used, each auxiliary circuit breaker's rating can be specified separately 304. Clicking a button 306 saves the selected values to the device. On the other hand, if the ratings of the auxiliary circuit breakers are stored in the branch current monitor, for example, in the current sensor memory 56, selecting a button 308 in the template causes the monitor's data processing system to be queried and to upload the ratings into the configuration tool.

Figure 7:
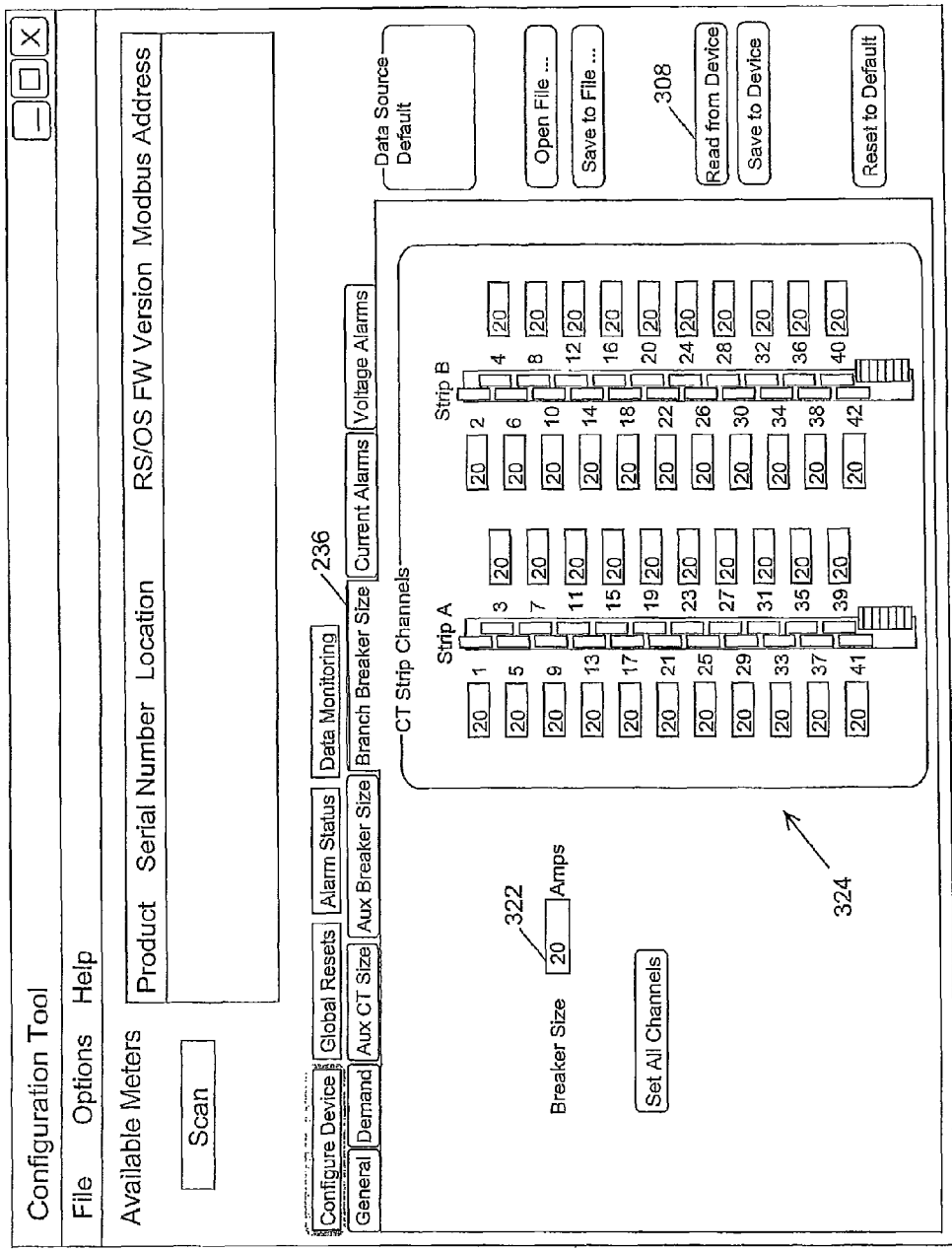
FIG. 7 illustrates a third template of the branch current monitor configuration tool of FIG. 5.

Referring to FIG. 7, selecting the Branch Breaker Size tab 236 on the initial display 200 produces a template enabling specification of the current ratings of the branch circuit breakers 320. If the branch circuit breakers have a common rating, the common rating can be entered 322 or, if various breakers have different ratings or are not used, the rating can be entered for a specific circuit breaker 324. The template suggests a default value for the circuit breaker current rating that is common for branch circuit breakers. If the ratings of the branch circuit breakers are stored in the branch current monitor, for example, in the current sensor memory, the template enables querying the monitor's data processing system to upload the ratings to the configuration tool by selecting a button 308 on the template.

Figure 8:
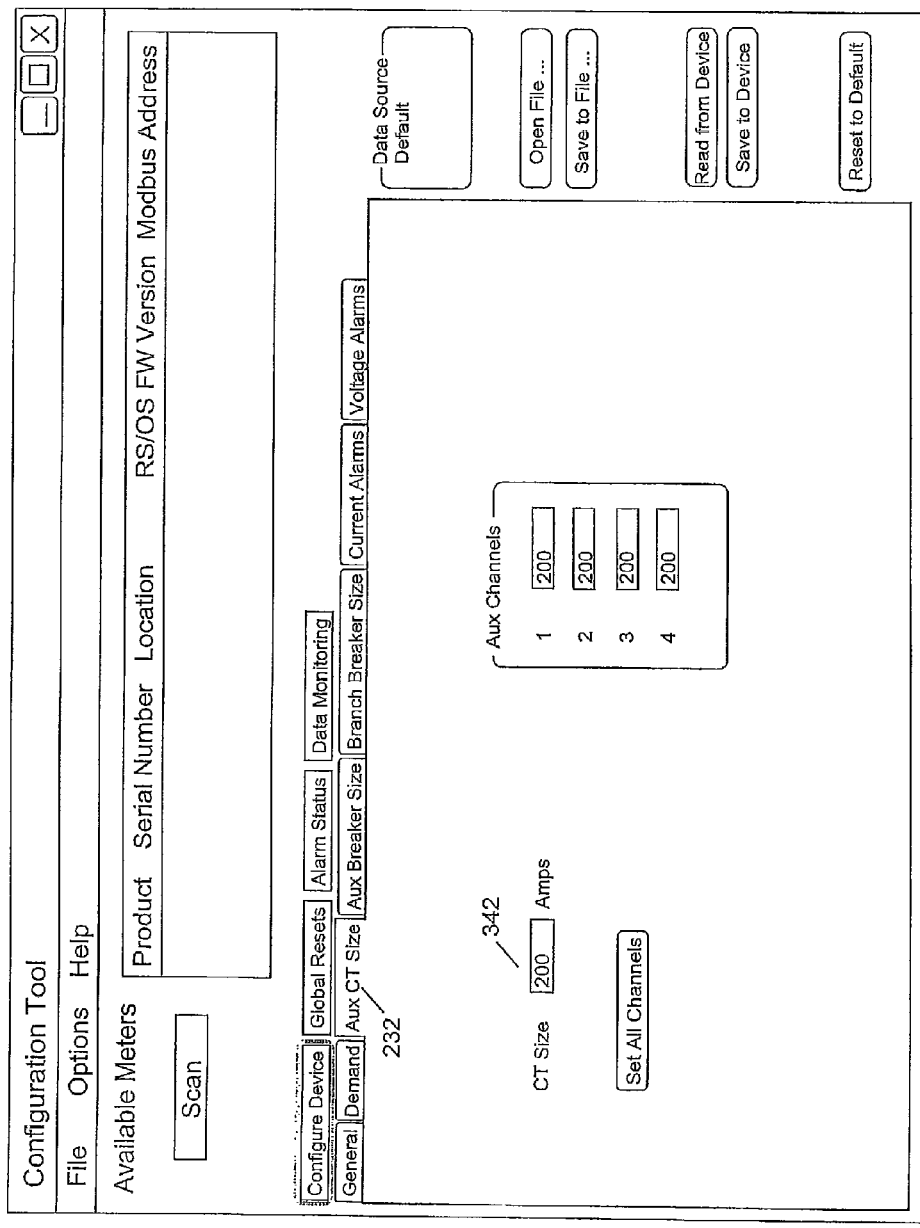
FIG. 8 illustrates a fourth template of the branch current monitor configuration tool of FIG. 5.

Referring to FIG. 8, selecting the AUX CT Size tab 232 produces a template enabling the installer to specify the ratings of the auxiliary current transformers 342 that monitor high amperage current, typically the current in the mains.

Figure 9:
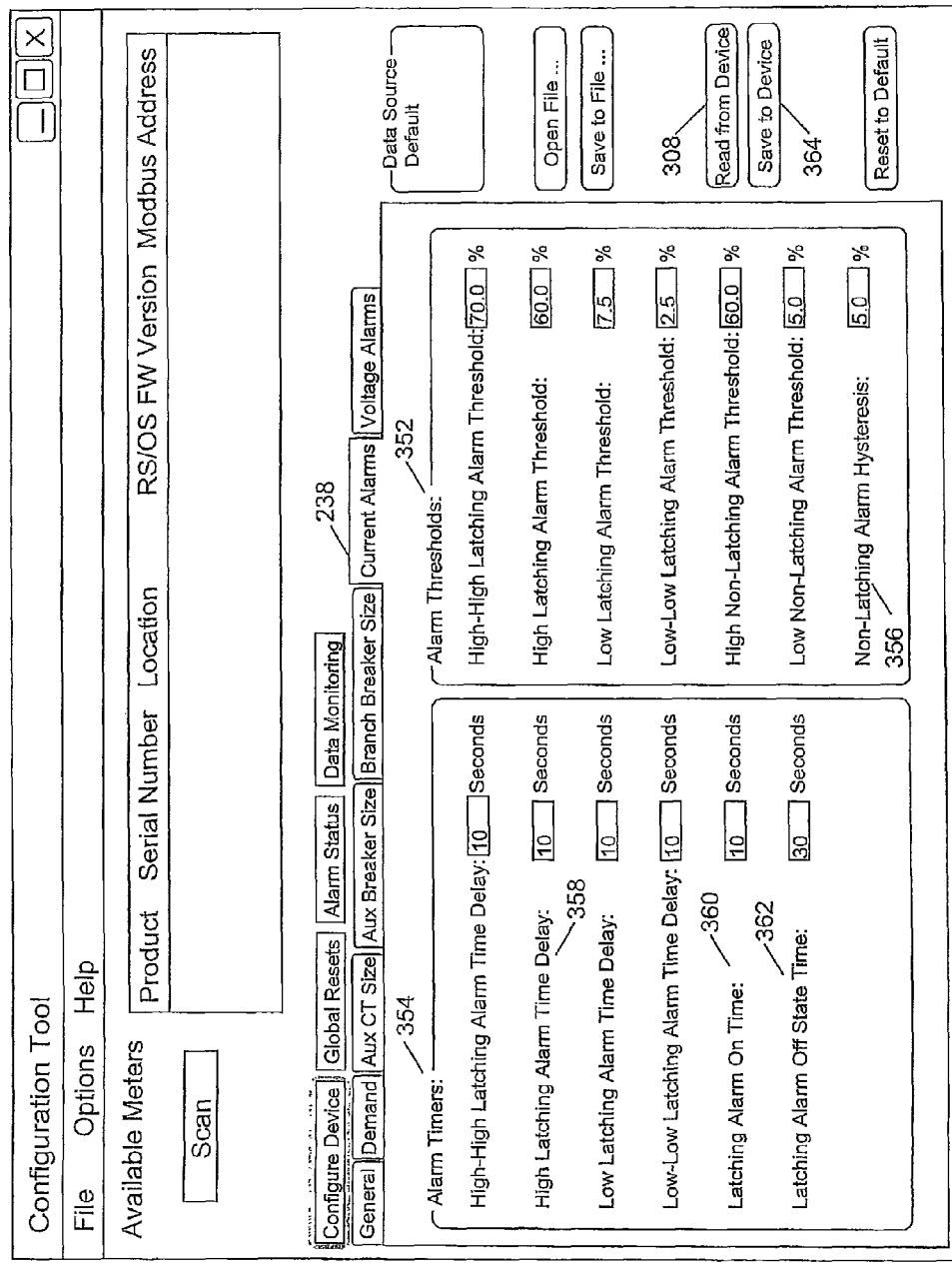
FIG. 9 illustrates a fifth template of the branch current monitor configuration tool of FIG. 5.

Referring to FIG. 9, selecting the Current Alarms tab 238 produces a template enabling the installer to specify the characteristics of the branch current monitor's current alarms 350 and suggests characteristic values for the alarm thresholds 352 and alarm timers 354. The branch current monitor may have both latching and non-latching alarms. If the current crosses a latching alarm threshold, the alarm is activated and will continue to operate until the alarm is manually reset. If the current crosses an alarm threshold for a non-latching alarm, the alarm is initiated, but the alarm will terminate if the current returns to a non-alarm level. A non-latching alarm hysteresis setting 356 specifies a difference between the threshold current for alarm activation and the threshold for alarm deactivation; the amount the current must fall below the high alarm threshold or rise above the low alarm threshold to deactivate the alarm. Hysteresis in the alarm prevents repeated initiation and termination of an alarm as a result of minor fluctuations in a current having a nominal value that is near the alarm threshold. A plurality of alarm current limits, for example, a high latching alarm and a high-high latching alarm having a higher alarm threshold, enables a user to determine the seriousness of a current excursion.

In addition to the alarm thresholds, the installer can specify alarm timers 354 for each of the latching alarms. The time delay 358 is the number of seconds that the current in the circuit must be beyond the respective alarm threshold before the alarm is initiated. The latching alarm on time 360 specifies the time in seconds that the current needs to stay above the low-low alarm threshold before the latching alarms are activated and the latching alarm off time 362 specifies the number of seconds that the current must be less than the low-low alarm threshold before the latching alarms are deactivated. Typical values are provided for the alarm thresholds and alarm timers as default values. The values of any alarms presently specified in the branch current monitor can be retrieved from the monitor's data processing unit by selecting a button 308 and the specified alarm characteristics can be saved to the current monitor by selecting another control button 364.

Figure 10:
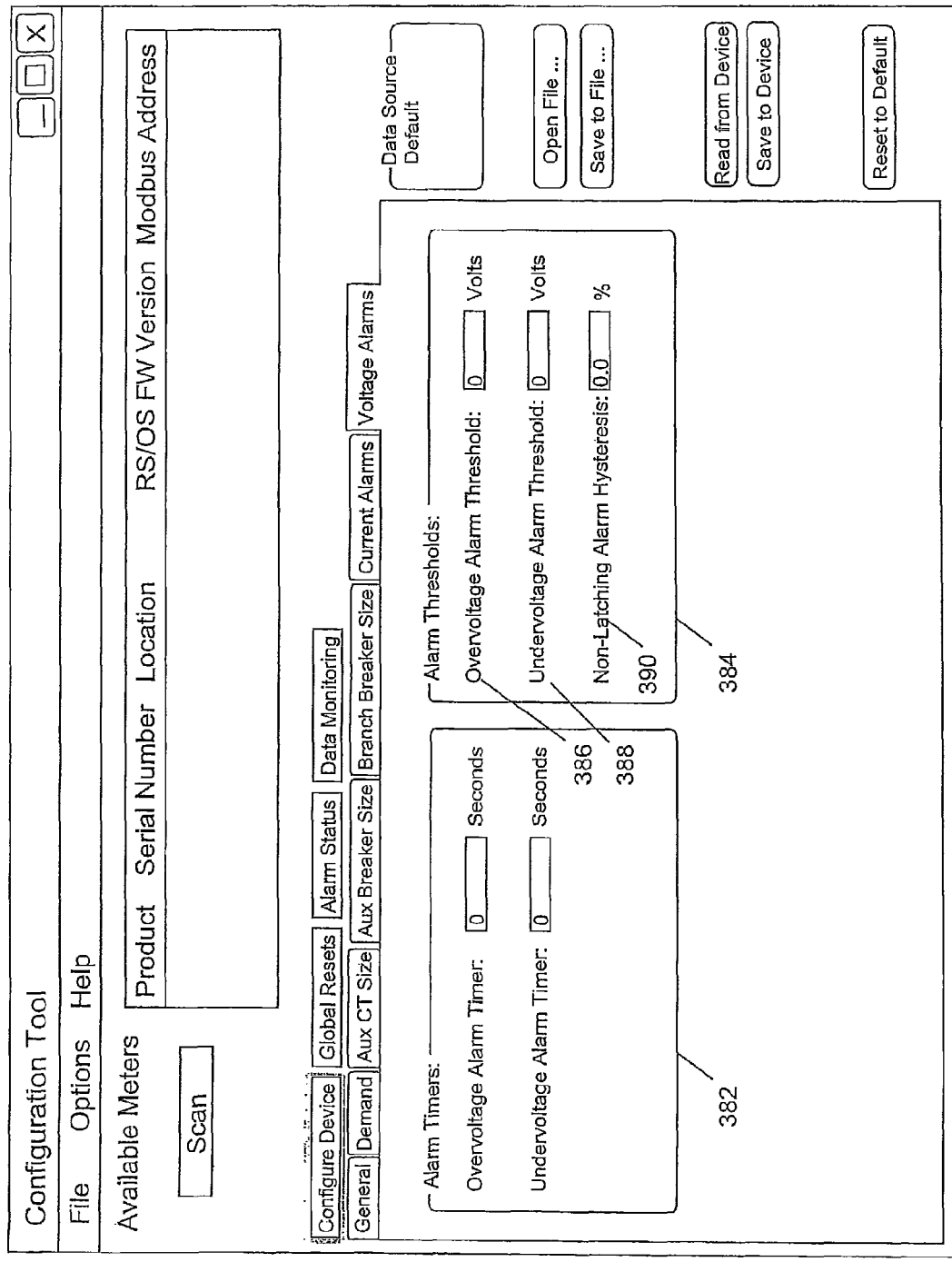
FIG. 10 illustrates a sixth template of the branch current monitor configuration tool of FIG. 5.

Referring to FIG. 10, selecting the voltage alarm tab 240 on the initial display produces a voltage alarm template 380 enabling the installer to specify the alarm delay 382 and alarm thresholds 384 of the branch current monitor's voltage alarms. The alarm timers specify the time intervals that the input voltage must be in an alarm state; i.e. exceeds the over voltage threshold or is less than the under voltage threshold, before the alarm is activated. If the voltage crosses an alarm threshold and then returns to a normal level before the alarm timer interval expires, the alarm timer is reset. The over voltage threshold 386 and the under voltage threshold 388 specify the values of the voltage that will activate the respective voltage alarms. The non-latching alarm hysteresis 390 specifies how much the voltage must fall below the over voltage threshold or rise above the under voltage threshold, as a percentage of the respective alarm threshold voltage, before a voltage alarm will be deactivated.

Figure 11:
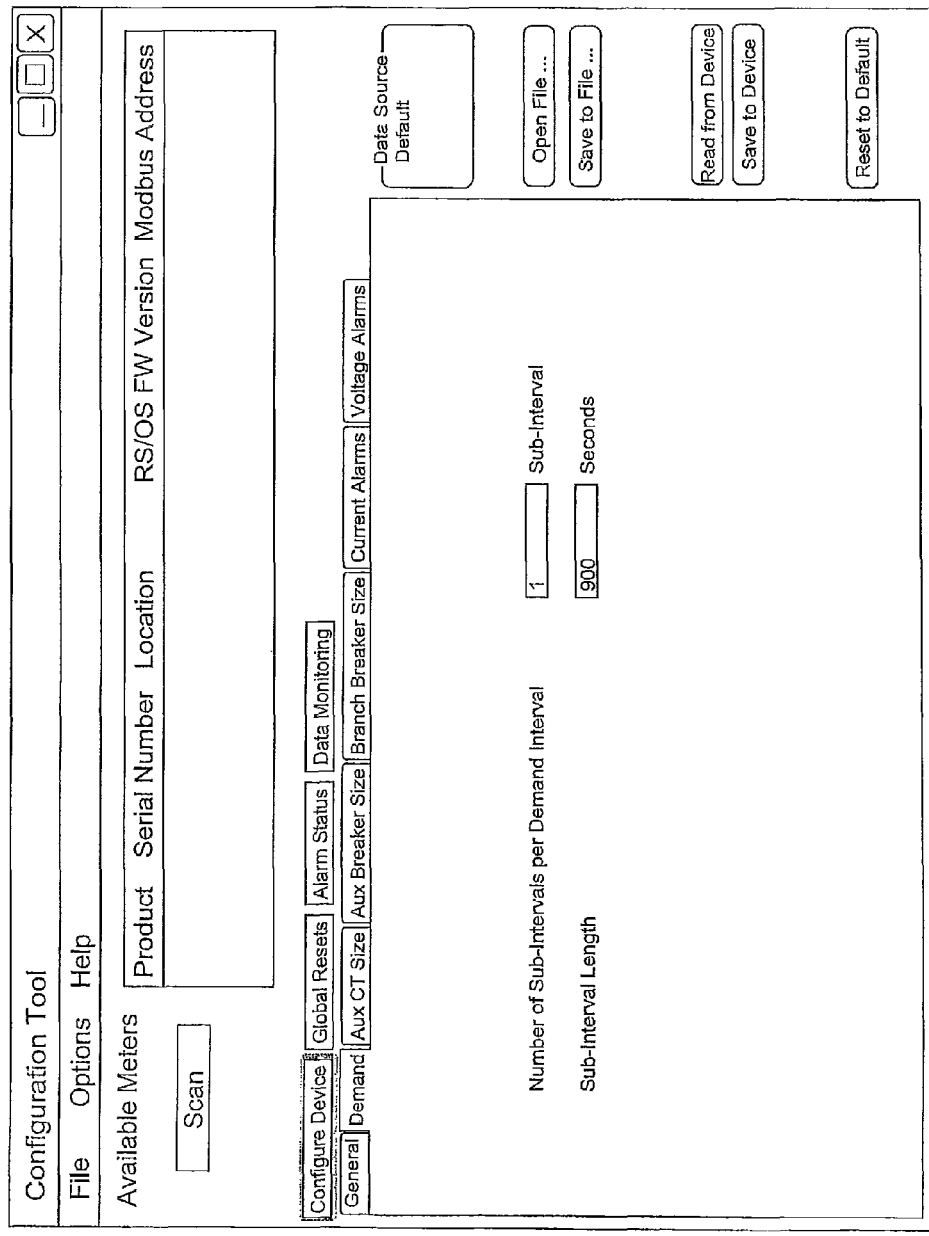
FIG. 11 illustrates a seventh template of the branch current monitor configuration tool of FIG. 5.

Referring to FIG. 11, selecting the Demand tab 230 produces a template 395 enabling the user to specify the interval at which the current and power values will be output. The demand is calculated by summing the average of the subinterval current and power samples divided by the number of subintervals in the specified demand interval. The subinterval average is recalculated every second from the RMS values of the power and current.

Figure 12:
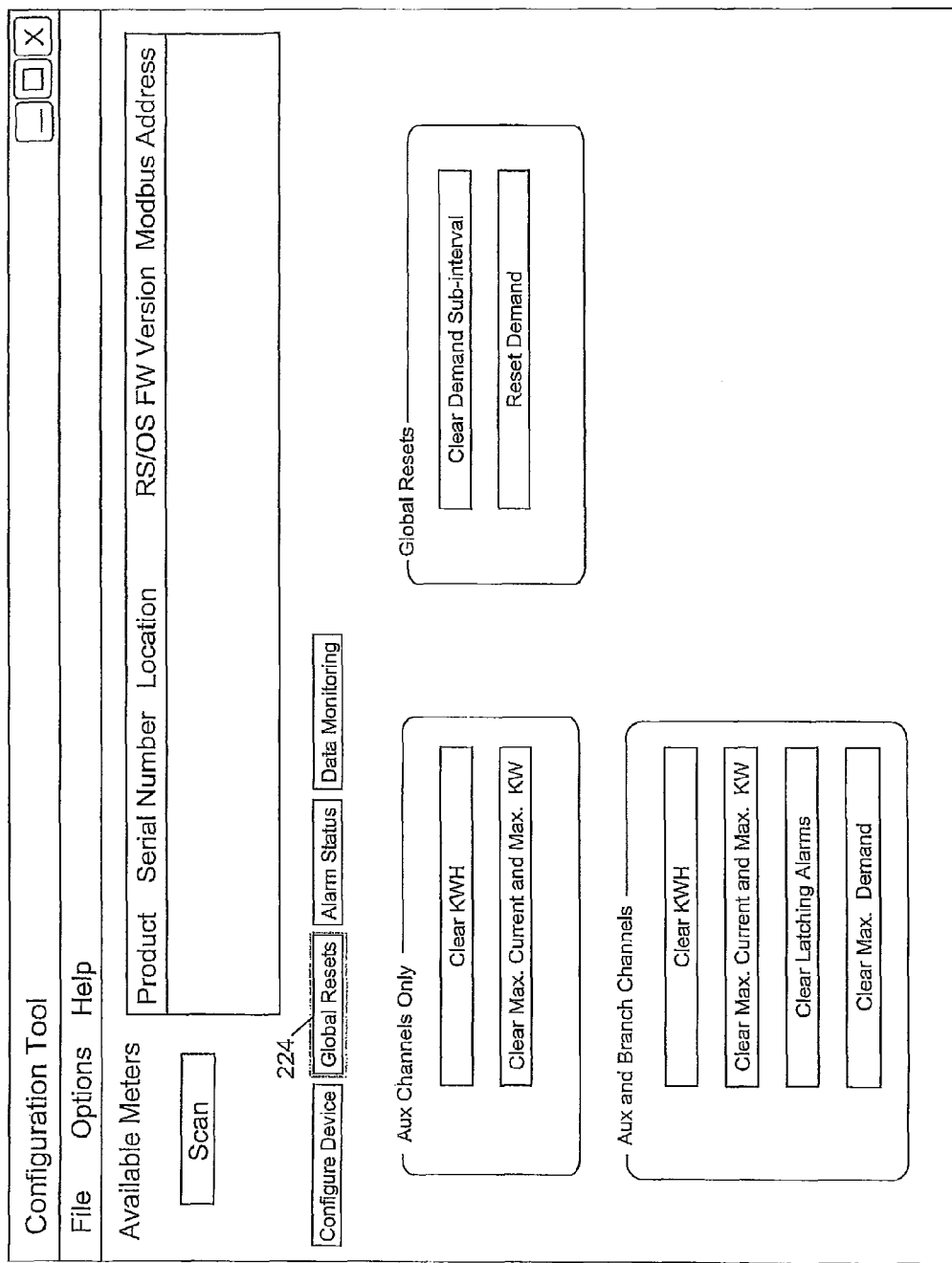
FIG. 12 illustrates an eighth template of the branch current monitor configuration tool of FIG. 5.

Referring to FIG. 12, selecting the global resets button 224 on the initial display produces a template enabling a user to reset all of the registers of the monitor's memory that are storing data produced by the monitor 410.

Figure 13:
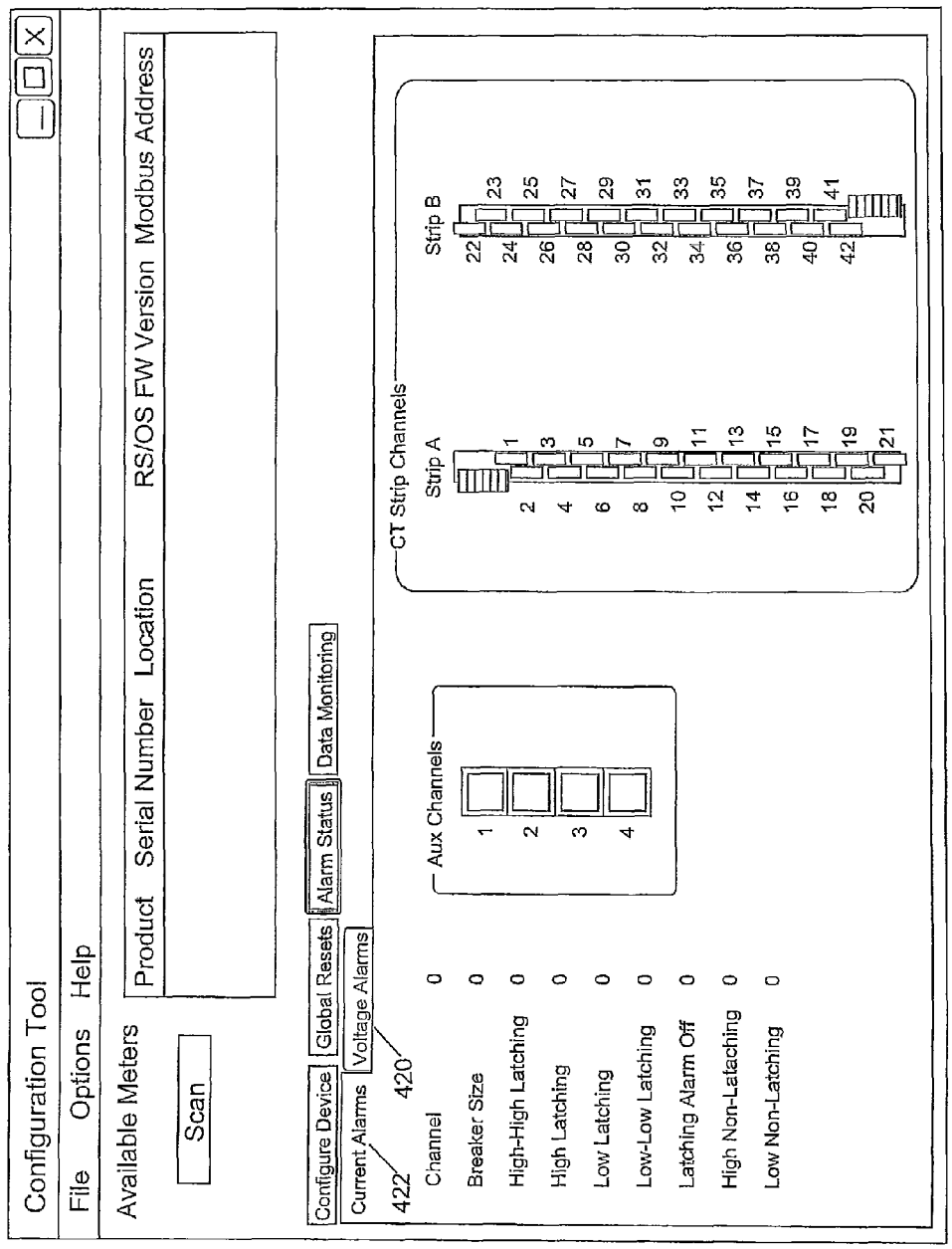
FIG. 13 illustrates a ninth template of the branch current monitor configuration tool of FIG. 5.

Referring to FIG. 13, selecting the alarm status button 326 on the initial display enables displaying the status of the current alarms 422 and the voltage alarms 420. The display identifies the transducer channel in which the alarm is activated, the size of the circuit breaker and the type of alarm.

Figure 14:
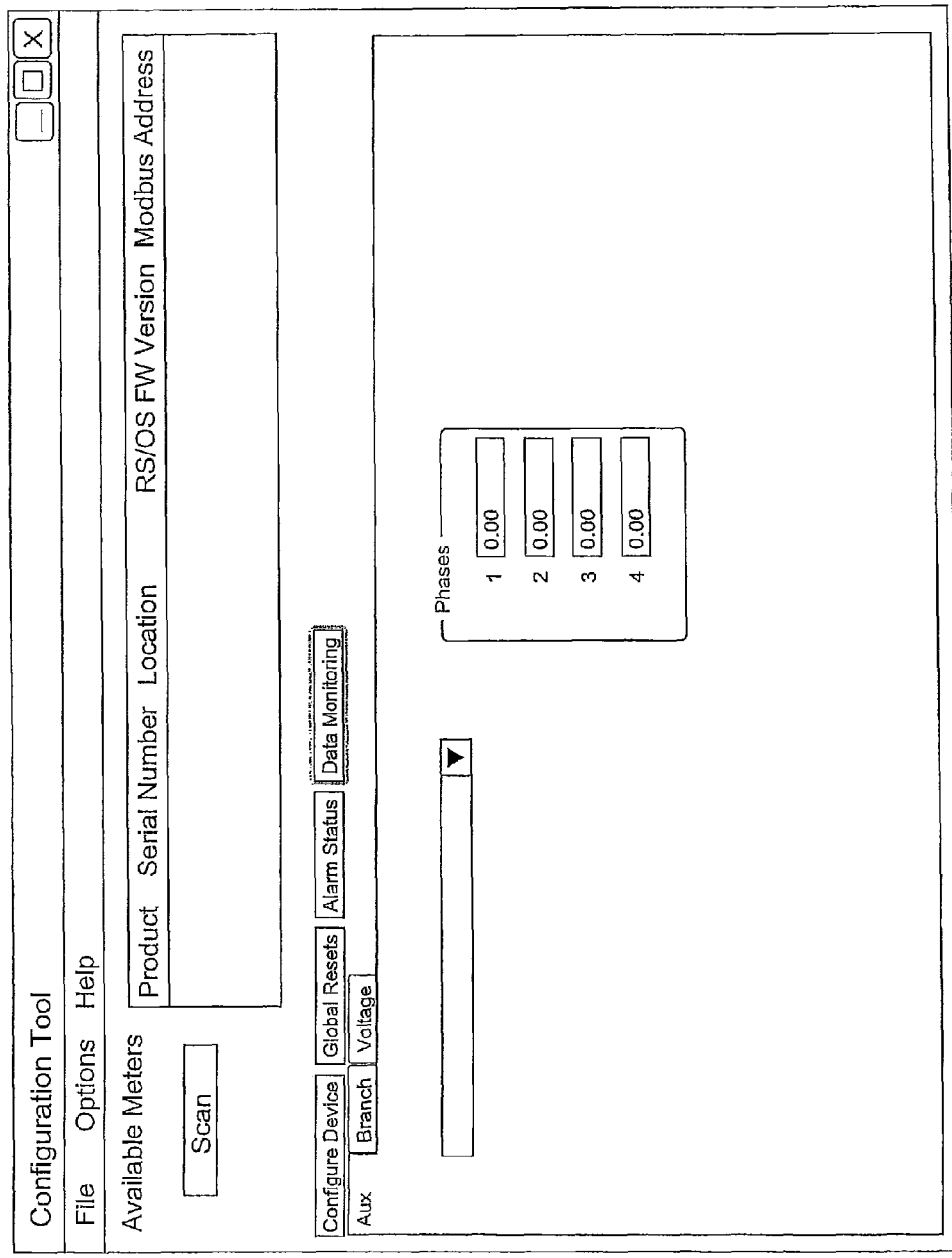
FIG. 14 illustrates a tenth template of the branch current monitor configuration tool of FIG. 5.

Referring to FIG. 14, selecting the data monitoring button 228 displays a template 420 that enables input of descriptive names for the various data channels for use during reporting by the monitor.

Figure 15:
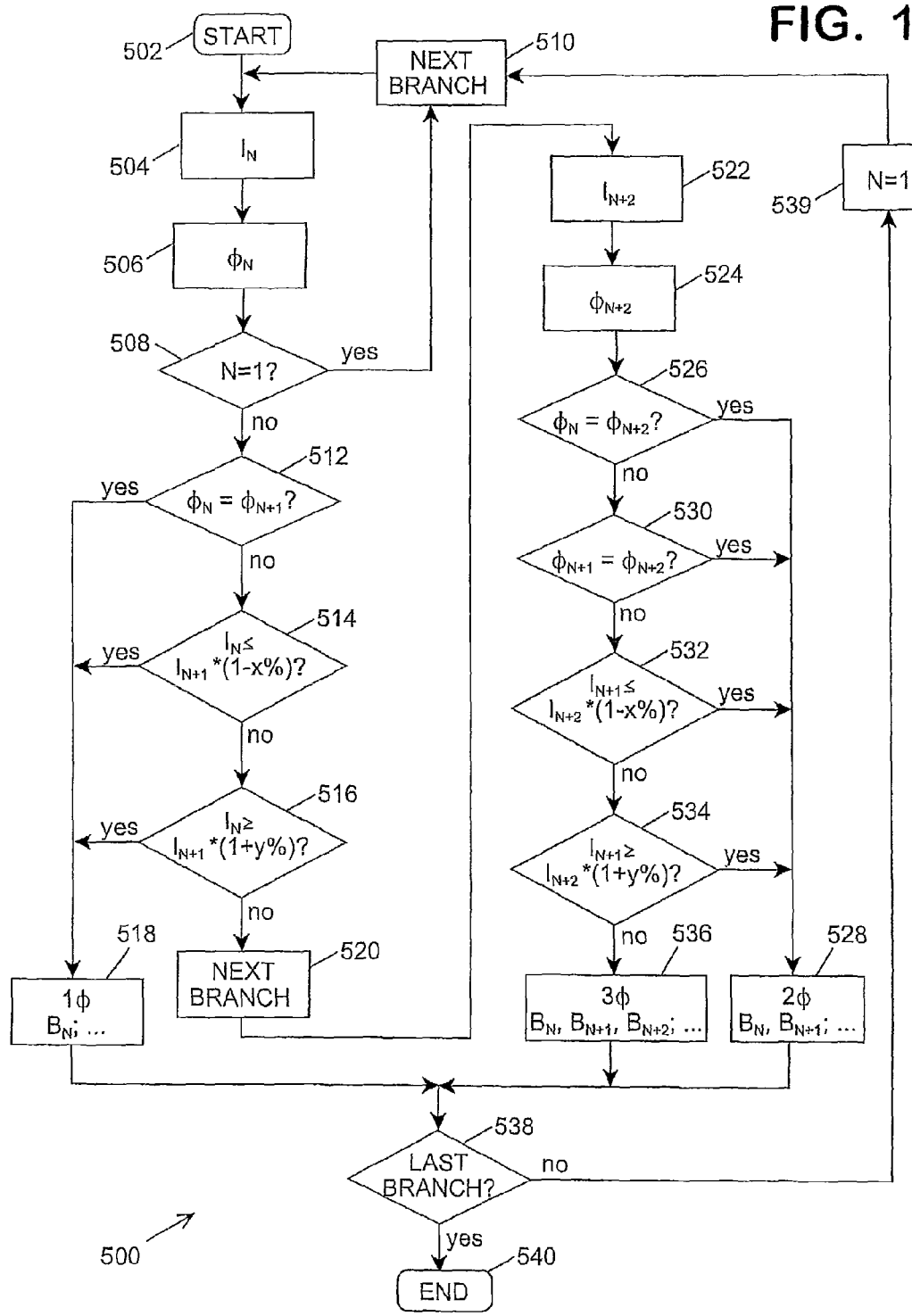
FIG. 15 is a flow diagram of an electrical connection discovery method.

The inventors concluded that the physical location of the circuit breakers, the identity of the bus bar or the phase of the power connected to a circuit breaker and the current in the respective branch circuits would enable the configuration tool to map the connections of the power distribution system. Referring to FIG. 15, the configuration tool facilitates mapping the branch circuits of the power distribution panel. For example, while the panel is de-energized a low power source can be connected, respectively, to the ones of the panels' bus bars. A continuity tester can be used to determine which bus bar is connected to each of the panel's circuit breakers and the results are stored in the computer's memory. When the panel is energized and the mapping method 500 initiated 502, the method reads the current for the first circuit breaker 504 and retrieves the phase ($\phi$) of the power, the identity of the bus bar to which the circuit breaker is connected, conducted by the circuit breaker 506. If the circuit breaker is the first circuit breaker being queried 508, the current and the phase are also read for the circuit breaker of the immediately adjacent branch circuit 510. Branch circuits conducting multiphase power are commonly connected to adjacent circuit breakers in the power distribution panel. If the phases of the two branches are the same 512, the first branch is designated as conducting single phase power 518. If the phases for the two branches are different 512, the method determines whether the current in the two branches is approximately equal, that is, the current in the first branch is more than a specified percentage of the current in the second branch 514 and less than specified percentage of the current in the second branch 516. If the currents in the two branches are substantially different, the power conducted by the first branch is designated as single phase power 518. If a branch is designated as supplying single-phase power, the method determines if the branch is the last branch of the panel 538 and, if not, the branch counter is reset 539 and the method moves to the next branch 510.

On the other hand, if the phases for two adjacent circuit breakers ($B_N$ and $B_{N+1}$) are different and the currents are approximately equal, the power in the two circuits is presumed to either two phase or three phase power. The next branch ($B_{N+2}$) is accessed 520 and the current 522 and phase 524 is determined. If the phase of the third circuit is different than the phase of the first circuit 526 and the phase of the second circuit 530, the currents in the second and third circuits are compared. If the current in the third circuit is not approximately equal to the current in the second circuit, that is, the current in second circuit is less than a specified percentage of the current in the third circuit 532 or the current in the second circuit is greater than a specified percentage of the current in the second circuit 534, the two branches are designated by the method as conducting two-phase power 528. However, if the phases of the three circuits are different and the currents in three circuits are approximately the same, the three branches are designated as parts of a three-phase circuit 536. If the latest branch accessed by the method is not the last branch monitored by the branch current monitor, the branch counter is reset 539 and the method proceeds to the next branch 510. If the latest branch accessed by the method, is the last monitored branch, the method ends 540 and the arrangement of branch circuit connections is stored in the monitor's memory.

The configuration tool simplifies the configuration of the branch current monitor by providing templates for entry of monitor characteristics and suggesting values of those characteristics and by automating the mapping the connections of the branch circuits.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A method for mapping a phase relationship of power conducted by ones of a plurality of branch circuit conductors, the method comprising the steps of:
   (a) storing in a memory accessible to a data processing unit an identity of a respective bus in a power distribution panel conductively connected to each of at least four branch circuit conductors, each bus conductively connectable to one of three voltage sources each conducting power of a different phase;
   (b) storing in said memory a proximity of each of said at least four branch circuit conductors to at least one other of said branch circuit conductors;
   (c) storing in said memory a magnitude of a current measured in each of said at least four branch circuit conductors;
   (d) said data processing unit executing an instruction to designate:
      (i) a first branch circuit conductor, a second branch circuit conductor and a third branch circuit conductor of said at least four conductors as conductors of three-phase power if said second branch circuit conductor is immediately adjacent to said first branch circuit conductor in said power distribution panel and said third branch circuit conductor is immediately adjacent to said second branch circuit conductor and if each of said first, second and third branch circuit conductors is respectively connected to a different bus and if a magnitude of a current in said first branch circuit conductor is substantially equal to magnitudes of currents in each of said second and said third branch circuit conductors;
      (ii) said first branch circuit and said second branch circuit conductors of said at least four conductors as conductors of two-phase power if said first branch circuit conductor and said second branch circuit conductor are adjacent and connected to different buses and if a magnitude of a current in said first branch circuit conductor is substantially equal to a magnitude of a current in said second branch circuit conductor; and (iii) said first branch circuit conductor of said at least four conductors as a conductor of single phase power if said first branch circuit conductor is not designated as a conductor of one of two-phase power and three-phase power; and (e) said data processing unit storing said designation of said phase of said power for each conductor of said at least four conductors in a memory accessible to a data processing unit of a branch circuit monitor.

2. A method of mapping a phase relationship of power conducted by ones of four or more a plurality of branch circuit conductors, the method comprising the steps of:

(a) storing in a memory accessible to a data processing unit an identity of a respective bus in a power distribution panel conductively connected to each one of at least four immediately adjacent branch circuit conductors, each bus connectable to one of three voltage sources conducting power of a different phase;

(b) storing in said memory a magnitude of a current measured in each of said branch circuit conductors;

(c) said data processing unit executing an instruction to designate:

(i) power conducted by said first branch circuit conductor as single-phase power if a first branch circuit conductor and a second branch circuit conductor are connected to a single bus;

(ii) power conducted by said first branch circuit conductor as single-phase power if said first branch circuit conductor and said second branch circuit conductor are connected to different busses and if a current in said first branch circuit conductor is not substantially equal to a current in said second branch circuit conductor;

(iii) power conducted by said first and said second branch circuit conductors as two-phase power if a current in said first branch circuit conductor is substantially equal to a current in said second branch circuit conductor and if said first branch circuit conductor and said second branch circuit conductor are connected to different busses and if said third branch circuit conductor is connected to one of said different busses;

(iv) power conducted by said first and said second branch circuit conductors as two-phase power if a current conducted by said third branch circuit conductor is not substantially equal to said current conducted by said first branch circuit conductor and said second branch circuit conductor and if said first branch circuit conductor, said second branch circuit conductor and said third branch circuit conductor are each connected to a different bus and if a current conducted by said first branch circuit conductor is substantially equal to a current conducted by said second branch circuit conductor; and (v) power conducted by said first branch circuit conductor, said second branch circuit conductor, and said third branch circuit conductor as three-phase power if said first branch circuit conductor, said second branch circuit conductor and said third branch circuit conductor are each connected to a different bus and if a current in said third branch circuit conductor is substantially equal to a current in first branch circuit conductor and a current in said second branch circuit conductor; and (d) said data processing unit storing said designation of said phase of said power in a memory accessible to a data processing unit of a branch circuit monitor.

3. A method of mapping in a memory of a branch circuit monitor a phase relationship of power conducted by ones of plural circuit breakers in a distribution panel, each circuit breaker interconnected with one of a plurality of voltage connections in an electric power distribution panel, each voltage connection connectable to a respective voltage source conducting power of a different phase, said method comprising the steps of:

(a) storing in a memory accessible to a data processing device an identity of a voltage connection connected to a first one of at least four circuit breakers in a distribution panel;

(b) storing in said memory an identity of a voltage connection connected to a second one of said at least four circuit breakers in said distribution panel, said second circuit breaker being immediately adjacent to said first circuit breaker in said power distribution panel; and (c) if said voltage connection connected to said first circuit breaker is the same as said voltage connection connected to said second circuit breaker, designating power conducted by said first branch circuit breaker as single-phase power with said data processing unit and storing said designation in a memory accessible by a data processing unit of a branch circuit monitor.

4. The method of mapping a phase relationship of power conducted by said ones of said circuit breakers of claim 3 further comprising the steps of:

(a) determining a magnitude of a current in said first circuit breaker with a current monitor;

(b) determining a magnitude of a current in said second circuit breaker with a current monitor; and (c) if said voltage connection connected to said first circuit breaker is not the same as said voltage connection connected to said second circuit breaker and if said current in said first circuit breaker is not substantially equal to said current in said second circuit breaker, designating power conducted by said circuit breaker as single-phase power with said data processing unit and storing said designation in said memory accessible by said data processing unit of said branch circuit monitor.

5. The method of mapping a phase relationship of power conducted by said ones of said circuit breakers of claim 4 further comprising the steps of:

(a) if said voltage connection connected to said first circuit breaker is not the same as said voltage connection connected to said second circuit breaker and if said current in said first circuit breaker is substantially equal to said current in said second circuit breaker, determining an identity of a voltage connection connected to a third one of said at least four circuit breakers in said distribution panel and storing said identity in said memory of said data processing unit, said third circuit breaker being immediately adjacent to said circuit breaker in said power distribution panel; and (b) if said voltage connection connected to said third circuit breaker is the same as said voltage connection connected to one of said first circuit breaker and said second circuit breaker, designating power conducted by said first circuit breaker and said second circuit breaker as two-phase power with said data processing unit and storing said designation in said memory accessible by said data processing unit of said branch circuit monitor.

6. The method of mapping a phase relationship of power conducted by said ones of said circuit breakers of claim 5 further comprising the steps of:
(a) if said voltage connection connected to said third circuit breaker is not the same as said voltage connection connected to one of said first circuit breaker and said second circuit breaker, determining a magnitude of a current in said third circuit breaker with said current monitor;
(b) with said data processing unit, designating in said memory accessible by said data processing unit of said branch circuit monitor power conducted by said first circuit breaker, said second circuit breaker and said third circuit breaker as three-phase power and if said current in said third circuit breaker, is substantially equal to said current in said second circuit breaker; and
(c) with said data processing unit, designating in said memory accessible by said data processing unit of said branch circuit monitor power conducted by said first circuit breaker and said second circuit breaker as two-phase power if said current in said third circuit breaker is not substantially equal to said current in said second circuit breaker.

* * * * *

UNITED STATES PATENT AND TRADEMARK OFFICE
CERTIFICATE OF CORRECTION

PATENT NO.         : 8,624,578 B2
APPLICATION NO.    : 12/765536
DATED              : January 7, 2014
INVENTOR(S)        : Matthew Rupert et al.

Page 1 of 1

It is certified that error appears in the above-identified patent and that said Letters Patent is hereby corrected as shown below:

In the Claims:

Col. 11, Line 17

Change "by ones of four or more a plurality of" to read --by ones of a plurality of--.

Col. 12, Line 28

Change "by said first branch circuit breaker" to read --by said first circuit breaker--.

Signed and Sealed this
First Day of July, 2014

Michelle K. Lee
*Deputy Director of the United States Patent and Trademark Office*